(12) United States Patent
Kurz et al.

(10) Patent No.: US 9,153,534 B2
(45) Date of Patent: Oct. 6, 2015

(54) SEMICONDUCTOR FUSE WITH ENHANCED POST-PROGRAMMING RESISTANCE

(71) Applicant: GLOBAL FOUNDRIES Inc., Grand Cayman (KY)

(72) Inventors: Andreas Kurz, Dresden (DE); Maciej Wiatr, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/517,407

(22) Filed: Oct. 17, 2014

(65) Prior Publication Data

US 2015/0034953 A1   Feb. 5, 2015

Related U.S. Application Data

(62) Division of application No. 13/960,038, filed on Aug. 6, 2013, now abandoned, which is a division of application No. 13/231,194, filed on Sep. 13, 2011, now Pat. No. 8,524,567.

(51) Int. Cl.
   *H01L 29/78* (2006.01)
   *H01L 23/525* (2006.01)
   *H01L 21/265* (2006.01)

(52) U.S. Cl.
   CPC ...... *H01L 23/5256* (2013.01); *H01L 21/26506* (2013.01)

(58) Field of Classification Search
   CPC .................................................. H01L 23/5256
   USPC ...................... 257/52, 506, E21.355, E29.325
   See application file for complete search history.

(56) References Cited

U.S. PATENT DOCUMENTS 6,335,253 B1 *   1/2002   Chong et al. ................... 438/305

* cited by examiner

*Primary Examiner* — Edward Wojciechowicz
(74) *Attorney, Agent, or Firm* — Ditthavong & Steiner, P.C.

(57) ABSTRACT

Post programming resistance of a semiconductor fuse is enhanced by using an implantation to form an amorphous silicon layer and to break up an underlying high-κ/metal gate. Embodiments include forming a shallow trench isolation (STI) region in a silicon substrate, forming a high-κ dielectric layer on the STI region, forming a metal gate on the high-κ dielectric layer, forming a polysilicon layer over the metal gate, performing an implantation to convert the polysilicon layer into an amorphous silicon layer, wherein the implantation breaks up the metal gate, and forming a silicide on the amorphous silicon layer. By breaking up the metal gate, electrical connection of the fuse contacts through the metal gate is eliminated.

19 Claims, 5 Drawing Sheets

SEMICONDUCTOR FUSE WITH ENHANCED POST-PROGRAMMING RESISTANCE

CROSS REFERENCE TO RELATED APPLICATIONS

This application is a Divisional of U.S. application Ser. No. 13/960,038, filed Aug. 6, 2013, which is a Divisional of U.S. Ser. No. 13/231,194 filed Sep. 13, 2011, now U.S. Pat. No. 8,524,567 issued on Sep. 3, 2013, the content of all of which are incorporated herein by reference in their entireties.

TECHNICAL FIELD

The present disclosure relates to semiconductor devices, and more particularly to programmable semiconductor fuses.

BACKGROUND

Semiconductor fuses are used for various purposes in semiconductor circuits. Such fuses are electrically programmable by the physical alteration of the structure of the fuses. A typical semiconductor fuse structure includes a vertical stack including a silicided semiconducting material, such as polysilicon, and a high-κ/metal gate (HKMG). The stack is patterned such that a narrow, elongated stack is formed to provide a fuse link, which is connected at opposite ends to cathode and anode contacts.

To electrically program the fuse, a programming current is moderated to cause a controlled electromigration of the material inside the electrical fuse structure. This type of programming raises the resistance of the programmed, or blown, fuse compared to that of an intact fuse. By measuring the resistance of an electrical fuse using sensing circuitry, it can be determined whether the electrical fuse has been programmed or is intact. Since the sensing circuitry may interpret any fuse with a resistance less than a lower limit as being intact, it is desirable to ensure that any programmed fuse maintains a resistance above the lower limit to avoid an erroneous reading. An improved electrical fuse structure that produces a high post-programming fuse resistance is therefore desired to reduce the error rate in electrical fuse programming, and thus to increase the reliability of electrical fuse programming.

Degradation of the post programming resistance of such a semiconductor fuse may occur when an HKMG remains underneath the polysilicon of the semiconductor fuse, allowing electrical connection to the anode and cathode contacts to remain, rendering the device insufficient. In gate first technologies, polysilicon fuses are formed concurrently with HKMG transistor gates. Therefore, removal of the HKMG beneath the polysilicon of the fuse would require etching of the polysilicon and HKMG and deposition of a dedicated polysilicon, to build a polysilicon fuse without a HKMG underneath. However, such a process involves an expensive etching step. In addition, amorphous silicon fuses exhibit higher post programming resistance than polysilicon fuses.

A need therefore exists for methodology enabling the cost-effective fabrication of semiconductor fuses for achieving a post-programming resistance distribution with higher resistance values and for enhancing the reliability of electrical fuse programming.

SUMMARY

An aspect of the present disclosure is a method of forming a semiconductor fuse with high post-programming resistance.

Another aspect of the present disclosure is a semiconductor fuse with high post-programming resistance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a shallow trench isolation (STI) region in a silicon substrate, forming a high-κ dielectric layer on the STI region, forming a metal gate on the high-κ dielectric layer, forming a polysilicon layer over the metal gate, performing an implantation to convert the polysilicon layer into an amorphous silicon layer, wherein the implantation breaks up the metal gate, and forming a silicide on the amorphous silicon layer.

Aspects of the present disclosure include forming cathode and anode contacts over opposite ends of the silicide to form a fuse structure having a fuse link between the cathode and anode contacts. Other aspects include implanting xenon (Xe) or germanium (Ge) for the implantation. Further aspects include performing the implantation at an energy of 80 keV to 150 keV. Another aspect includes forming the high-κ dielectric layer of hafnium oxide and lanthanum and forming the metal gate of titanium nitride (TiN). Additional aspects include forming nickel silicide (NiSi) for the silicide. Further aspects include breaking up the metal gate into discrete specks of material dispersed at the interface between the amorphous silicon layer and the STI region sufficiently to prevent or limit electrical conduction via the resulting broken-up metal gate.

Another aspect of the present disclosure is a device including a shallow trench isolation (STI) region in a silicon substrate; an amorphous silicon layer formed on the STI region; a silicide formed on the amorphous silicon layer; and cathode and anode contacts over opposite ends of the silicide, wherein the amorphous silicon layer is formed by forming an HKMG and a polysilicon layer on the STI region, performing an implantation on the polysilicon layer, wherein the implantation converts the polysilicon into amorphous silicon and concurrently breaks up the HKMG.

Aspects of the present disclosure include a device including an amorphous silicon layer, silicide, and cathode and anode contacts being configured to form a fuse structure, said fuse structure including a fuse link between the cathode and anode contacts. Further aspects include the resulting broken-up HKMG including discrete specks of material dispersed at the interface between the amorphous silicon layer and the STI region. Other aspects include the specks being sufficiently dispersed to prevent or limit electrical conduction to the contacts. Additional aspects include the HKMG including a first layer of hafnium oxide and lanthanum formed on the shallow trench isolation region, and a second layer of TiN formed on the first layer. Another aspect includes the implantation being performed by implanting Xe or Ge. Further aspects include the implantation being performed at an energy of 80 keV to 150 keV. Other aspects include a silicide including NiSi.

Yet another aspect of the present disclosure is a method including forming an STI region in a silicon substrate; forming an HKMG comprising a high-κ dielectric layer and a TiN metal gate on the STI region; forming a polysilicon layer on the HKMG; implanting Xe in the polysilicon layer at an energy of 80 keV to 150 keV, wherein the implantation converts the polysilicon to amorphous silicon and breaks up the HKMG and disperses the HKMG material to eliminate electrical conduction across the HKMG; forming NiSi on the amorphous silicon layer; and forming an anode contact at one end of the nickel silicide and a cathode contact at the other end of the NiSi; wherein the amorphous silicon layer and the NiSi form a fuse link between the anode and cathode contacts.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
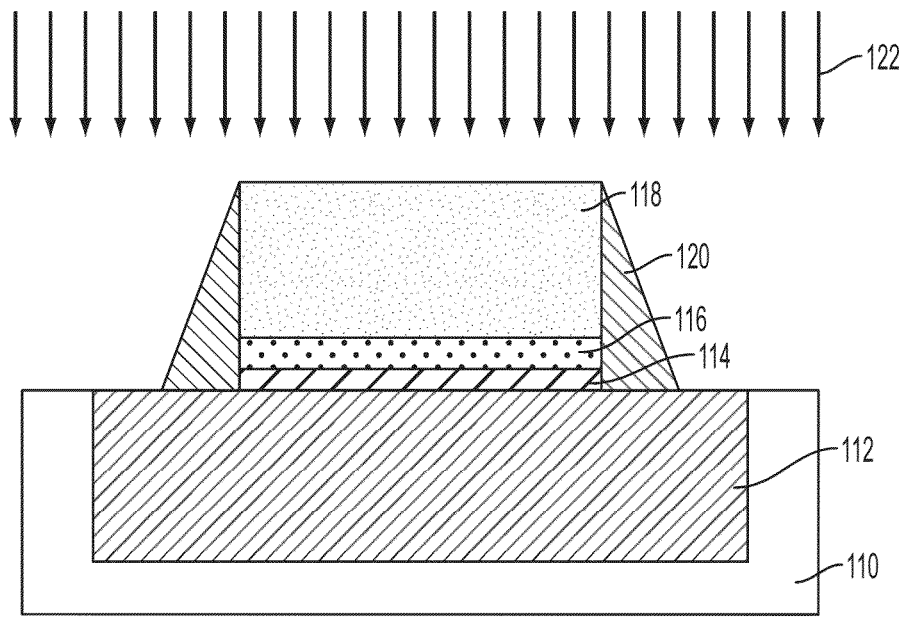
FIGS. 1A and 1B schematically illustrate a process flow for fabricating a semiconductor fuse, according to an exemplary embodiment, and FIGS. 1C and 1D schematically illustrate the fuse post-programming.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present invention provides an electrical fuse structure for achieving a post-programming resistance distribution with higher resistance values and to enhance the reliability of electrical fuse programming. Post-programming resistance of a semiconductor fuse is enhanced by using an implantation to convert a polysilicon layer into an amorphous silicon layer and to break up an underlying HKMG. Embodiments include forming an STI region in a silicon substrate, forming a high-κ dielectric layer on the STI region, forming a metal gate over the high-κ dielectric layer, forming a polysilicon layer over the metal gate, performing an implantation to convert the polysilicon layer into an amorphous silicon layer, wherein the implantation breaks up the metal gate, and forming a silicide on the amorphous silicon layer.

The present disclosure addresses and solves, inter alia, the problem of post-programming resistance degradation in semiconductor fuses, while eliminating the need for costly etching steps in fabricating the fuses. By performing an implantation to convert the polysilicon layer into an amorphous silicon layer, the electromigration of silicide during programming may be improved, thereby increasing the post-programming resistance. Further, the implantation breaks up a metal gate underneath the polysilicon layer thereby preventing or limiting electrical conduction between the fuse contacts via the metal gate. The resulting broken-up metal gate is in the form of discrete specks of material dispersed at the interface between the amorphous silicon layer and the STI region, and such specks of material are sufficiently dispersed as to limit or eliminate electrical conduction via the resulting broken-up metal gate, which would degrade the post-programming resistance.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
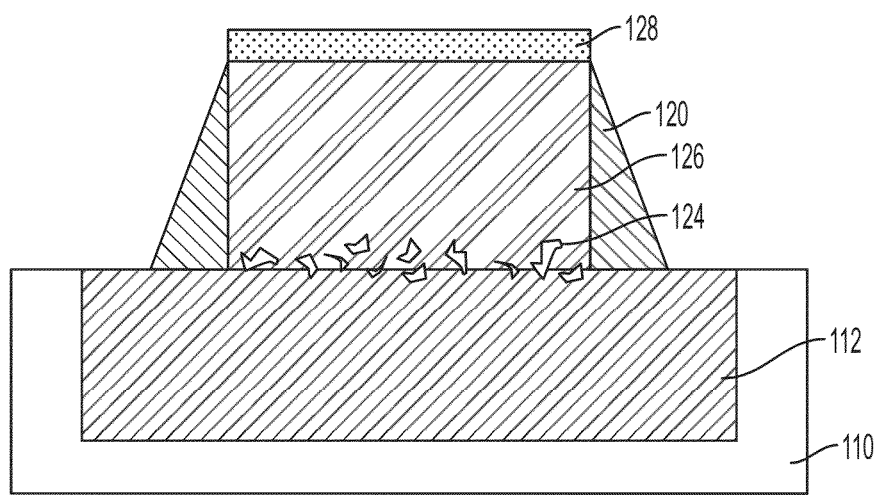

FIGS. 1A and 1B schematically illustrate a process flow for fabricating a semiconductor device, according to an exemplary embodiment.

Adverting to FIG. 1A, a silicon substrate 110 is provided. A shallow trench isolation (STI) region 112 is formed in the silicon substrate 110. STI region 112 may be formed, for example, with a thermal conductivity in the range of 1.2 to 1.4 W/(m·K) to provide thermal isolation. An HKMG is formed on STI region 112. In this embodiment, the HKMG includes a high-κ dielectric layer 114, for example of hafnium oxide and lanthanum, formed on STI region 112, and a metal gate 116, for example of titanium nitride, formed on high-κ dielectric layer 114. A polysilicon layer 118 is formed over the HKMG, and spacers 120 may be provided along opposite sides of the stack of high-κ dielectric layer 114, metal gate 116, and polysilicon layer 118.

As shown in FIG. 1A, an implantation 122 is performed, for example by implanting Xe. Alternatively, Ge may be employed for the implantation. The implantation energy used depends on the height of polysilicon layer 118, and, for 28 nanometer (nm) technologies (e.g., 28 nm low power technologies), the implantation energy may be 80 keV to 150 keV. Further, the Xe or Ge may be implanted with a concentration of 1e14 cm$^{-2}$ to 1e16 cm$^{-2}$. The implantation process has the effect of amorphizing polysilicon layer 118, and interrupting or "breaking up" the HKMG, as will be discussed further below.

Subsequent to the implantation shown in FIG. 1A, the high-κ dielectric layer 114 is gone, metal gate 116 has been broken up into specks 124, and polysilicon layer 118 has been converted into an amorphous silicon layer 126. A silicide 128 may then be formed on the amorphous silicon layer 126. Silicide 128 is formed of, for example, NiSi. Thus, the implantation process shown in FIG. 1A breaks up the HKMG, and the resulting broken-up metal gate is in the form of discrete specks 124 of material dispersed within amorphous silicon layer 126 at the interface with STI region 112.

Figure 1C:
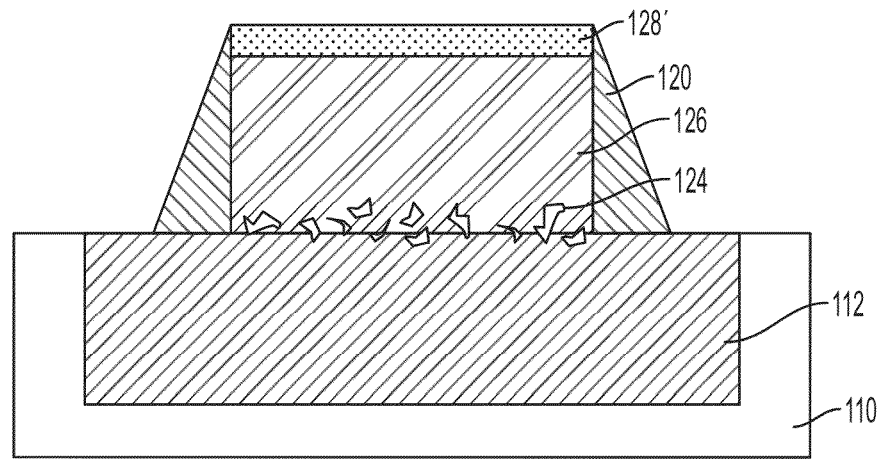
Figure 1D:
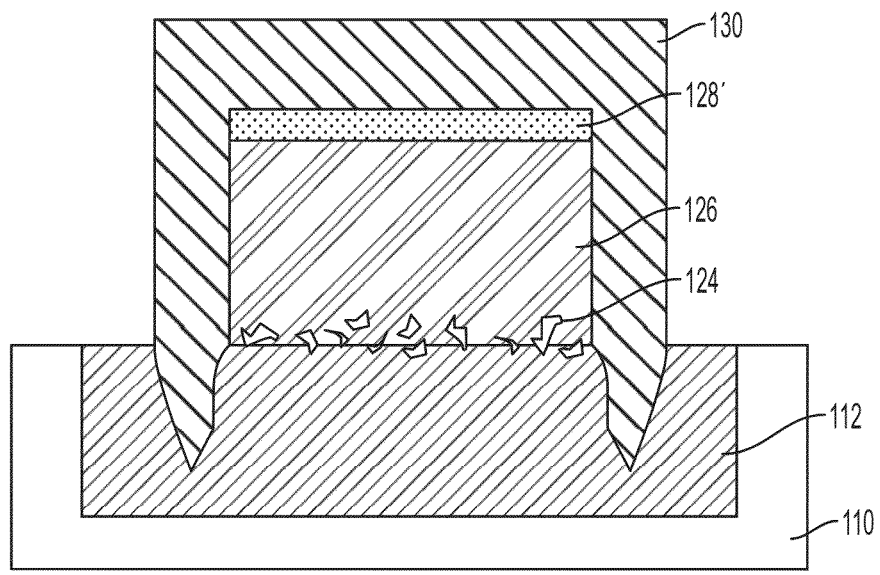
Figure 2:
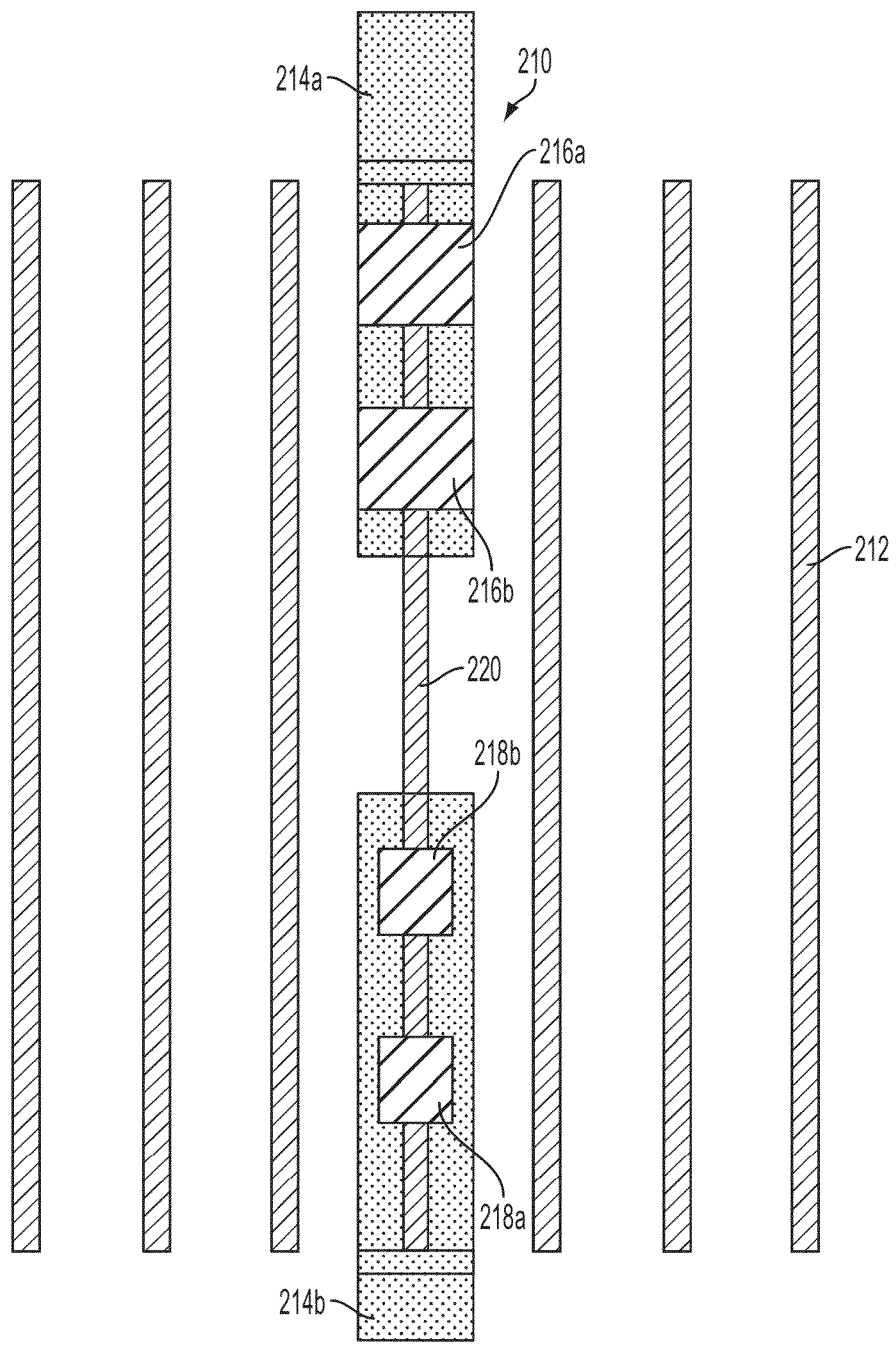
FIG. 2 illustrates a semiconductor fuse structure according to an exemplary embodiment.

Adverting to FIG. 1C, silicide 128 is electromigrated into amorphous silicon layer 126 (the programming mechanism) during a fuse process to form NiSi layer 128'. FIG. 1D illustrates the structure shown in FIG. 1C with a contact 130 formed thereover. Contact 130 may be formed as either a cathode contact or an anode contact over the silicide to complete the fuse structure, such as is shown in FIG. 2. As illustrated in FIG. 1D, by breaking up the metal gate, electrical conduction between the contacts is prevented or limited, thereby reducing degradation of post-programming resistance.

FIG. 2 illustrates a semiconductor fuse structure 210 according to an exemplary embodiment. FIG. 2 illustrates various polysilicon lines 212, the middle of which is manufactured using the process depicted in FIGS. 1A and 1B, to form semiconductor fuse structure 210. Fuse structure 210 includes first layers of metal lines 214a, 214b formed over the device. Metal line 214a is connected to cathode contacts 216a, 216b, and metal line 214b is connected to anode contacts 218a, 218b. A fuse link 220, formed in the manner depicted in FIG. 1D, is provided between the cathode and anode contacts.

Semiconductor fuse structure 210 may be programmed by using the cathode and anode contacts to moderate a level of programming current therebetween to cause a controlled electromigration of the silicide inside the fuse structure 210. Fuse link 220, post-programming, will have a high resistance.

Figure 3:
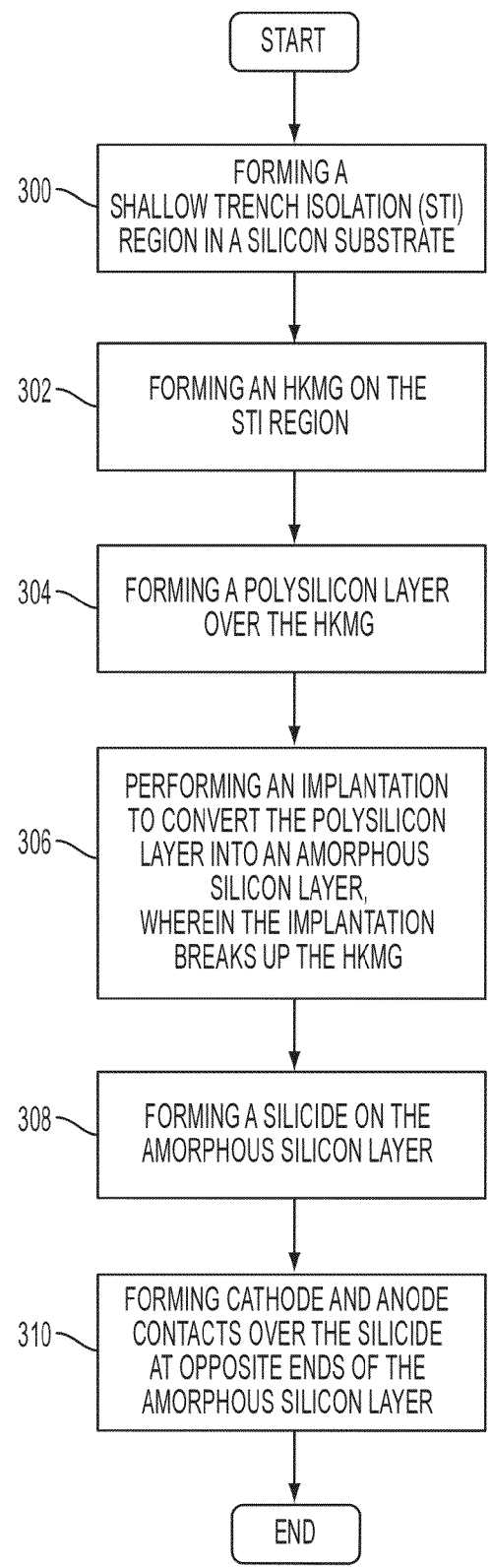
FIG. 3 a flowchart of a process flow for fabricating a semiconductor fuse, according to an exemplary embodiment.

FIG. 3 a flowchart of a process flow for manufacturing a semiconductor device according to an exemplary embodiment. In step 300, a shallow trench isolation (STI) region is form in a silicon substrate. In step 302, an HKMG is formed on the shallow trench isolation region. The HKMG may include a high-κ dielectric layer formed, for example, of hafnium oxide and lanthanum, and a metal gate formed, for example, of titanium nitride. In step 304, a polysilicon layer is formed over the HKMG. In step 306, an implantation is performed to convert the polysilicon layer into an amorphous silicon layer, wherein the implantation breaks up the underlying HKMG.

In step 308, a silicide is formed on the amorphous silicon layer. In step 310, cathode and anode contacts are formed over the silicide region at opposite ends of the amorphous silicon layer. The anode and cathode contacts may be formed with a fuse link provided therebetween, to form a semiconductor fuse structure. Thus, a stack is patterned such that a narrow, elongated piece of material is formed to provide a fuse link, which is connected at opposite ends to cathode and anode contacts. The semiconductor fuse structure can be programmed by performing an electromigration programming of the silicide by using the cathode and anode contacts to moderate a level of the programming current therebetween to cause a controlled electromigration of the material inside the fuse structure. Breaking up the HKMG prevents or limits electrical conduction via the metal gate, thereby improving post-programming resistance of the fuse structure.

Figure 4:
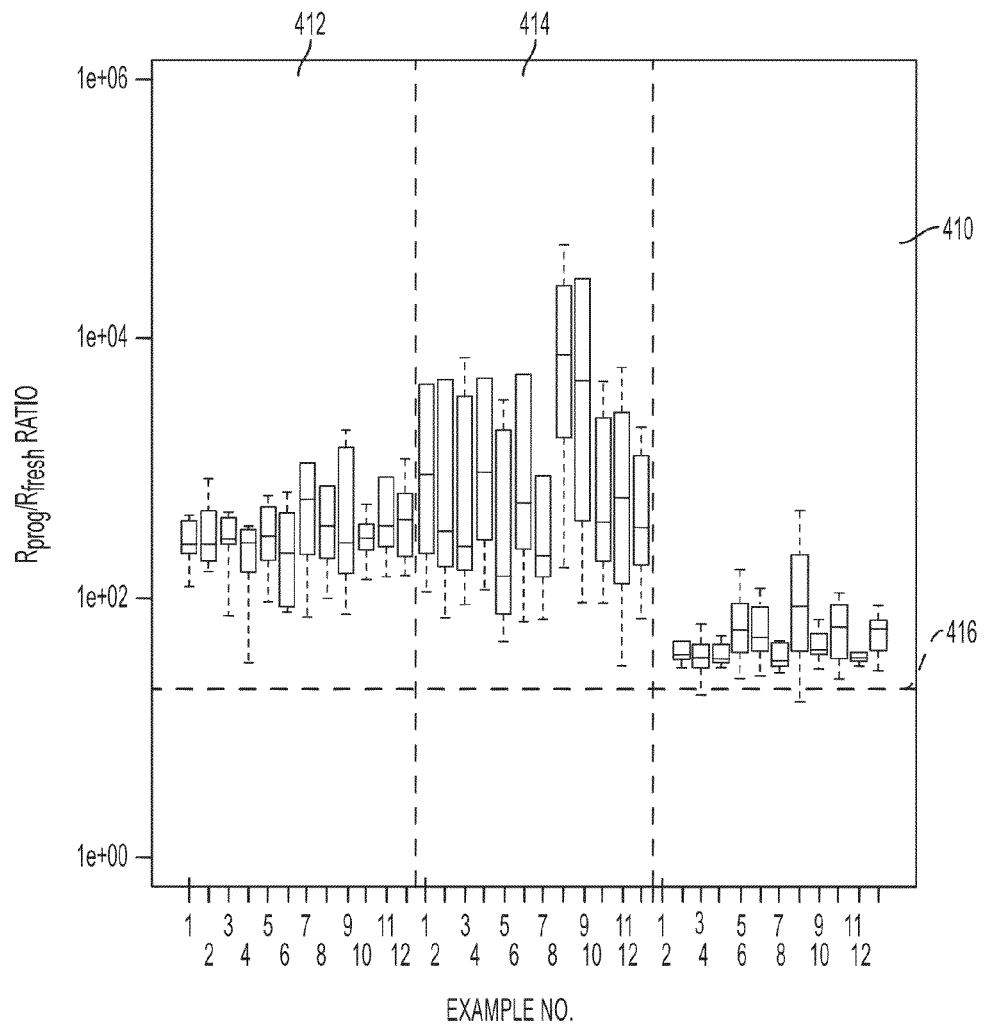
FIG. 4 is a chart setting forth experimental data regarding post-programming resistance distributions of semiconductor fuse structures fabricated according to various methods.

FIG. 4 is a chart setting forth experimental data regarding post-programming resistance distributions of semiconductor fuse structures manufactured according to various methods.

The chart depicted in FIG. 4 sets forth three different regions showing post-programming resistance distributions that relate to three different semiconductor fuse structures. The first region 410 depicts experimental data for a semiconductor fuse structure that is formed from a stack having a polysilicon layer with an HKMG remaining underneath the polysilicon layer. The second region 412 depicts experimental data for a semiconductor fuse structure that is formed from a stack, in which the polysilicon layer and the HKMG underneath the polysilicon layer are removed by etching, and a dedicated amorphous silicon is formed in their place. The third region 414 depicts experimental data for an embodiment of a semiconductor fuse structure such as shown in FIGS. 1A through 1D and 2, that is formed from a stack, in which an implantation is performed on a polysilicon layer with an HKMG underneath to convert the polysilicon layer into an amorphous silicon layer, and the implantation breaks up the HKMG underneath the polysilicon layer to prevent or limit electrical conduction via the HKMG.

In FIG. 4, regions 410, 412, and 414 represent experimental data for semiconductor fuses with polysilicon, with polysilicon removed and replaced with amorphous silicon, and with amorphous silicon formed in accordance with the present disclosure, respectively. Further, in FIG. 4, line 416 represents the lower limit of a ratio of a post-programming resistance ($R_{prog}$) to a reference resistance ($R_{fresh}$) of a reference semiconductor fuse. Since a semiconductor fuse may be erroneously interpreted as being intact, rather than being programmed, if the post-programming resistance of the semiconductor fuse drops below the lower limit line 416, it is desirable to ensure that any programmed fuse maintains a resistance above the lower limit.

As can be seen in FIG. 4, the first region 410 depicts experimental data that shows post-programming fuse resistance distributions that are comparatively narrow in overall distribution, and that are comparatively close to the lower limit line 416. In fact, two of the examples in the first region 410 show lower distribution limits that extend beneath the lower limit line 416. Therefore, the polysilicon semiconductor fuse structures represented in the first region 410 do not provide sufficient reliability, and would result in a high error rate in electrical fuse programming.

The second region 412 depicts experimental data that shows post-programming fuse resistance distributions that are broader in overall distribution than in the first region 410, and that are comparatively further above the lower limit line 416 than in the first region 410. However, the etching process used to remove the polysilicon layer and the HKMG underneath the polysilicon layer in order to form the amorphous silicon semiconductor fuse structure of the second region 412 is costly and time consuming.

The third region 414 depicts experimental data that shows post-programming fuse resistance distributions that are broad in overall distribution. The data is comparatively further above the lower limit line 416 than in the first region 410 and similar, relative to the lower limit line 416, in comparison to the second region 412. Thus, the amorphous silicon semiconductor fuse structure represented in the third region 414 achieves superior reliability results over the first region 410, while avoiding the need to perform a costly etching process required for the semiconductor fuse represented in the second region 412. Accordingly, the semiconductor fuse structure represented in the third region 414, formed in accordance with the present disclosure, provides an improved electrical fuse structure that produces a post-programming fuse resistance distribution at a high level and, therefore, increases its programming reliability.

The embodiments of the present disclosure can achieve several technical effects, particularly in forming cost effective semiconductor fuse structures with high reliability, and manufacturing throughput. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A passive device comprising:
   a shallow trench isolation (STI) region in a silicon substrate;
   an amorphous silicon layer formed on the STI region;
   a silicide formed on the amorphous silicon layer; and
   cathode and anode contacts over opposite ends of the silicide,
   wherein the amorphous silicon layer is formed by:
   forming a high-κ/metal gate (HKMG) and a polysilicon layer on the STI region;
   performing an implantation on the polysilicon layer, wherein the implantation converts the polysilicon into amorphous silicon and concurrently breaks up the HKMG.

2. The passive device according to claim 1, wherein the amorphous silicon layer, silicide, and cathode and anode contacts are configured to form a fuse structure, said fuse structure including a fuse link between the cathode and anode contacts.

3. The passive device according to claim 2, wherein the resulting broken-up HKMG comprises discrete specks of material dispersed at the interface between the amorphous silicon layer and the STI region.

4. The passive device according to claim 3, wherein the specks are sufficiently dispersed to prevent or limit electrical conduction to the contacts.

5. The passive device according to claim 2, wherein the HKMG includes a first layer of hafnium oxide and lanthanum formed on the shallow trench isolation region, and a second layer of titanium nitride formed on the first layer.

6. The passive device according to claim 2, wherein the implantation is performed by implanting xenon.

7. The passive device according to claim 6, wherein the implantation is performed at an energy of 80 keV to 150 keV.

8. The passive device according to claim 2, wherein the implantation is performed by implanting germanium.

9. The passive device according to claim 8, wherein the implantation is performed at an energy of 80 keV to 150 keV.

10. The passive device according to claim 2, wherein the silicide comprises nickel silicide.

11. A passive device comprising:
    a shallow trench isolation (STI) region in a silicon substrate;
    a high-κ/metal gate (HKMG) comprising a high-κ dielectric layer and a titanium nitride (TiN) metal gate on the STI region;
    a polysilicon layer on the HKMG;
    an implantation in the polysilicon layer, wherein the implantation converts the polysilicon to amorphous silicon and breaks up the HKMG and disperses the HKMG material to eliminate electrical conduction across the HKMG;
    a silicide on the amorphous silicon layer; and
    an anode contact at one end of the silicide and a cathode contact at the other end of the silicide;
    wherein the amorphous silicon layer and the silicide form a fuse link between the anode and cathode contacts.

12. The passive device according to claim 11, wherein the resulting broken-up HKMG comprises discrete specks of material dispersed at the interface between the amorphous silicon layer and the STI region.

13. The passive device according to claim 12, wherein the specks are sufficiently dispersed to prevent or limit electrical conduction to the contacts.

14. The passive device according to claim 11, wherein the HKMG includes a first layer of hafnium oxide and lanthanum formed on the shallow trench isolation region, and a second layer of titanium nitride formed on the first layer.

15. The passive device according to claim 11, wherein the implantation is performed by implanting xenon.

16. The passive device according to claim 15, wherein the implantation is performed at an energy of 80 keV to 150 keV.

17. The passive device according to claim 11, wherein the implantation is performed by implanting germanium.

18. The passive device according to claim 17, wherein the implantation is performed at an energy of 80 keV to 150 keV.

19. The passive device according to claim 11, wherein the silicide comprises nickel silicide.

* * * * *